(12) United States Patent
Schamberger et al.

(10) Patent No.: US 6,229,206 B1
(45) Date of Patent: May 8, 2001

(54) BONDING PAD TEST CONFIGURATION

(75) Inventors: Florian Schamberger, Bad Reichenhall; Helmut Schneider, München, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/326,366

(22) Filed: Jun. 4, 1999

(30) Foreign Application Priority Data

Jun. 4, 1998 (DE) .............................. 198 25 009

(51) Int. Cl.[7] ..................................... H01L 29/40
(52) U.S. Cl. .................... 257/690; 257/48; 257/503; 257/673; 257/700; 257/758; 257/778; 257/781
(58) Field of Search .............................. 257/48, 503, 673, 257/700, 758, 778, 781, 690

(56) References Cited

U.S. PATENT DOCUMENTS 5,751,015   5/1998   Corbett et al. .
5,838,023 * 11/1998   Goel et al. .............................. 257/48

* cited by examiner

Primary Examiner—Fetsum Abraham
(74) Attorney, Agent, or Firm—Herbert L. Lerner; Laurence A. Greenberg; Werner H. Stemer

(57) ABSTRACT

A bonding pad test configuration for establishing whether or not a semiconductor chip is bonded. The test configuration has a circuit that evaluates a state of a bond between a bonding wire and the bonding pad and is able to activate and deactivate operating and test modes depending on the bond state established. To this end, the bonding pad is divided into at least two parts, so that the circuit produced in the semiconductor chip itself can use signals derived from the parts of the bonding pad to establish whether or not the bonding wire is in contact with the parts.

3 Claims, 1 Drawing Sheet

BONDING PAD TEST CONFIGURATION

BACKGROUND OF THE INVENTION

Field of the Invention

The present invention relates to a bonding pad test configuration for establishing whether or not a semiconductor chip is bonded. The configuration has a circuit that evaluates a state of a bond between a bonding wire and a bonding pad and is able to activate and deactivate operating and test modes depending on the determined bond state.

When semiconductor chips are being manufactured and when they have to pass through operating and test modes, it should always be evident whether or not the respective semiconductor chips are already reliably bonded. For this, it would be particularly advantageous if the semiconductor chip were itself able to recognize whether or not it is already bonded, so that it is then possible for the individual operating and test modes to be activated and deactivated depending on its respective fitment state. Such a property of the semiconductor chip would have the considerable advantage that it would be possible to dispense with putting the chip into an appropriate test lab, with the considerable waste of time that this entails. Until now, no-one has thought of producing a test configuration with which a semiconductor chip can itself recognize whether or not it is already bonded.

SUMMARY OF THE INVENTION

It is accordingly an object of the invention to provide a bonding pad test configuration, which overcomes the above-mentioned disadvantages of the prior art devices of this general type, in which a semiconductor chip is able to establish whether or not it is already bonded, in order for it to be possible to activate and deactivate respective operating and test modes depending on the bond state determined for the semiconductor chip.

With the foregoing and other objects in view there is provided, in accordance with the invention, in a semiconductor chip, a bonding pad test configuration for determining if the semiconductor chip is bonded, including:

a bonding pad divided into at least two parts; and a circuit for evaluating a state of a bond between a bonding wire and the bonding pad, the circuit disposed in the semiconductor chip and using signals derived from the at least two parts of the bonding pad to determine if the bonding wire is in contact with the at least two parts, the circuit activating and deactivating operating and test modes in dependence on the state of the bond determined by the circuit.

The invention achieves the object with a test configuration of the type mentioned in the introduction in that the bonding pad is divided into at least two parts, so that the circuit produced in the semiconductor chip itself can use signals derived from the parts of the bonding pad to establish whether or not the bonding wire is in contact with the parts.

The bonding pad is preferably subdivided into two parts. If necessary, however, it is also possible for it to be subdivided into more than two parts.

Hence, the present invention describes a completely different approach than that of the previous prior art. The test configuration according to the invention does not establish correct bonding of bonding pads through test signals being supplied to the semiconductor chip externally by the wires connected to the bonding pads. Instead, the semiconductor chip itself tests whether or not it is already correctly bonded in that it contains a circuit which evaluates whether or not the bonding pads, which are each divided into at least two parts, are in contact with the bonding wire.

This makes use of the fact that the resistance between two parts of the bonding pad that are not connected to the bonding wire is virtually infinitely large. Whereas the resistance between two parts of a bonding pad that are electrically connected to one another by the bonding wire is around zero. Hence, the circuit provided in the semiconductor chip evaluates merely whether the resistance between the two parts is around zero or around infinity.

Such circuits can be constructed in a great variety of ways. They must merely be capable of recognizing whether or not the at least two parts of a bonding pad are conductively connected to one another by a bonding wire.

Other features which are considered as characteristic for the invention are set forth in the appended claims.

Although the invention is illustrated and described herein as embodied in a bonding pad test configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTIONS OF THE DRAWINGS

DESCRIPTION OF THE PREFERRED EMBODIMENTS

Figure 2:
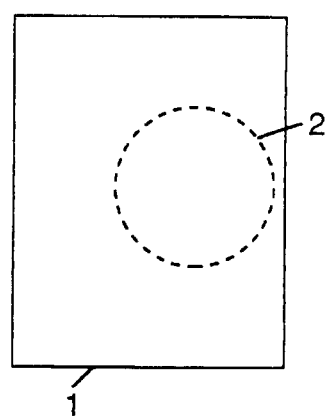
FIG. 2 is a plan view of a prior art bonding pad.

In all the figures of the drawing, sub-features and integral parts that correspond to one another bear the same reference symbol in each case. Referring now to the figures of the drawings in detail and first, particularly, to FIG. 2 thereof, there is shown a conventional bonding pad 1 to which a bonding wire 2 is attached, as indicated by dashed lines. In the example in FIG. 2, the full extent of the bonding wire 2 is in contact with the bonding pad 1. It is conceivable, however, for the bonding wire 2 to be only partly in contact with the bonding pad 1, resulting in a poor connection between the bonding wire 2 and the bonding pad 1. This can even go as far as the bonding wire 2 touching a semiconductor chip next to the bonding pad 1, so that no contact at all is made with the bonding pad 1.

Figure 1:
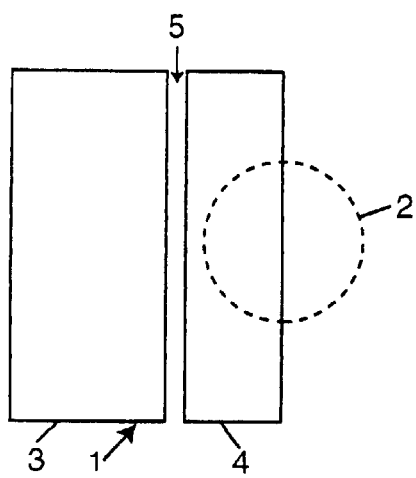
FIG. 1 is a diagrammatic, plan view of a bonding pad in which a bonding wire is in contact with only one part of the bonding pad according to the invention.

In the test configuration according to the invention, therefore, the bonding pad 1 is subdivided into two parts 3, 4 that are isolated from one another by a gap 5, as shown in FIG. 1. Therefore, in the configuration of FIG. 1, the electrical resistance between the parts 3 and 4, provided that these are not conductively connected to one another by a bonding wire, is around infinity. If the parts 3, 4 are connected by a bonding wire 2, however, the resistance between the parts 3, 4 is around zero.

FIG. 1 now shows a schematic illustration of a case in which the bonding wire 2 is only partly in contact with the bonding pad 1, so that only part 4 is electrically connected to the bonding wire 2. Hence, in this case, the bonding wire 2 makes "poor" contact with the bonding pad 1.

The "poor" contact between the bonding pad 1 and the bonding wire 2 is easily recognized by the test configuration. The parts 3 and 4 are not electrically connected to one another, so that the electrical resistance between the parts 3 and 4 is around infinity. A circuit provided in the semiconductor chip is able to establish this state easily, so that the semiconductor chip is itself able to detect whether or not it is already correctly bonded.

If the bonding wire 2 is situated next to the bonding pad 1 or if bonding has not yet taken place, then the resistance between the parts 3 and 4 is obviously also around infinity. In this case too, the test configuration is immediately able to establish that the bonding wire 2 has not yet made contact with the bonding pad 1.

Figure 3:
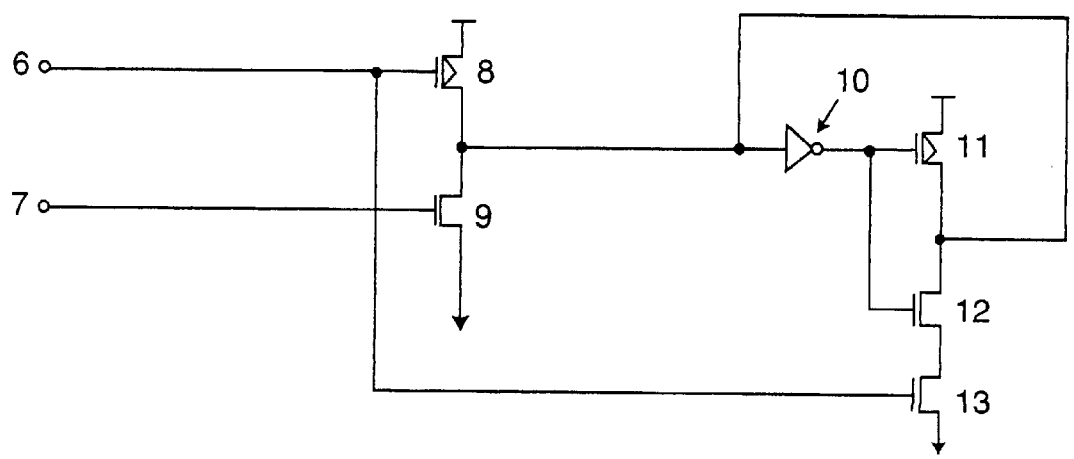
FIG. 3 is a circuit diagram of a circuit that is able to recognize whether or not the two parts of the bonding pad are conductively connected according to the invention.

By way of example, FIG. 3 shows a possible circuit for evaluating a state of the parts 3, 4 of the bonding pad 1. To this end, connections 6, 7 of the circuit are connected to the parts 3, 4, which, as shown in FIG. 1, do not need to be the same size. The connection 6 is connected to a gate of a p-channel MOS transistor 8 and a gate of an n-channel MOS transistor 13. The connection 7 is connected to a gate of an n-channel MOS transistor 9. The transistors 8, 9 are connected in series between a supply voltage and earth, their common node being connected to an input of an inverter 10 and to a common node of a p-channel MOS transistor 11 and an n-channel MOS transistor 12. An output of the inverter 10 is connected to a gate of the transistor 11 and to a gate of the transistor 12. Furthermore, the transistors 11, 12 and 13 are connected in series between ground and the supply voltage.

The inverter 10 and the transistor 11 form a latch element which stores a different value depending on whether or not the connections 6 and 7 are connected to one another.

Obviously, it is also possible to have other exemplary embodiments of the circuit for evaluating the connection state of the parts 3, 4 of the bonding pad 1. FIG. 3 shows only one example of this.

The semiconductor chip is thus immediately able to recognize that it is bonded. Hence, operating and test modes can be activated or deactivated depending on the assembly state, which results in a considerable advantage in terms of time, since the semiconductor chip does not need to be put into a test lab.

We claim:

1. In a semiconductor chip, a bonding pad test configuration for determining whether the semiconductor chip is bonded, comprising:

a bonding pad divided into at least two parts; and an evaluation circuit disposed in the semiconductor chip and using signals derived from said at least two parts of said bonding pad to determine whether the bonding wire is in contact with said at least two parts.

2. The test configuration according to claim 1, wherein said at least two parts of said bonding pad are two parts.

3. The test configuration according to claim 1, wherein said evaluation circuit activates and deactivates operating and test modes in dependence on the state of the contact of said bonding wire as determined by said evaluation circuit.

* * * * *